(12) United States Patent
Lou et al.

(10) Patent No.: US 7,675,307 B2
(45) Date of Patent: Mar. 9, 2010

(54) HEATING APPARATUS FOR SEMICONDUCTOR DEVICES

(75) Inventors: Choon Leong Lou, Jhudong Township (TW); Li Min Wang, Jhudong Township (TW); Yi Ming Lau, Jhudong Township (TW); Ho Yeh Chen, Jhudong Township (TW)

(73) Assignee: Star Technologies Inc., Jhudong Township (TW)

( * ) Notice: Subject to any disclaimer, the term of this patent is extended or adjusted under 35 U.S.C. 154(b) by 59 days.

(21) Appl. No.: 12/050,204

(22) Filed: Mar. 18, 2008

(65) Prior Publication Data

US 2009/0237102 A1 Sep. 24, 2009

(51) Int. Cl.
*G01R 31/28* (2006.01)
(52) U.S. Cl. .................... 324/760; 324/765
(58) Field of Classification Search ......... 324/754–765, 324/158.1; 186/39; 221/2; 312/35
See application file for complete search history.

(56) References Cited

U.S. PATENT DOCUMENTS

| | | | | |
|---|---|---|---|---|
| 2,865,698 A | * | 12/1958 | Smith | ............................ 312/35 |
| 3,628,845 A | * | 12/1971 | Grimm | ........................ 312/309 |
| 3,656,058 A | * | 4/1972 | Leathers | ...................... 324/760 |
| 4,145,620 A | * | 3/1979 | Dice | ........................... 307/149 |
| 4,542,341 A | * | 9/1985 | Santomango et al. | ........ 324/760 |
| 4,683,424 A | * | 7/1987 | Cutright et al. | .............. 324/537 |
| 5,574,384 A | | 11/1996 | Oi | |
| 6,102,162 A | * | 8/2000 | Teicher | ......................... 186/39 |
| 6,459,571 B1 | * | 10/2002 | Carteau | .................. 361/679.33 |
| 7,131,040 B2 | | 10/2006 | Co et al. | |

* cited by examiner

*Primary Examiner*—Ernest F Karlsen
(74) *Attorney, Agent, or Firm*—Connolly Bove Lodge & Hutz LLP

(57) ABSTRACT

A heating apparatus for semiconductor devices comprises an oven including a front wall having a plurality of front openings and a back wall having a plurality of back openings each with isolating self-closing doors, a carrier module configured to load semiconductor devices into the oven through the front opening in a removable manner, a temperature-controlling module configured to control the temperature of the oven, and a test module positioned at a backside of the oven and configured to generate, receive or switch electrical test signals for the semiconductor devices in the oven.

11 Claims, 9 Drawing Sheets

HEATING APPARATUS FOR SEMICONDUCTOR DEVICES

BACKGROUND OF THE INVENTION (A) Field of the Invention

The present invention relates to a heating apparatus for semiconductor devices, and more particularly, to a heating apparatus with a design for a removable carrier for device-under-test (DUT) allowing initiation of a burn-in or reliability test for a new carrier loaded with semiconductor devices while other carriers with semiconductor devices is undergoing burn-in or reliability test in the same heating apparatus without having to open the heating apparatus which can impact the temperature of the devices under test.

(B) Description of the Related Art

Semiconductor circuits are initially manufactured as wafers. A circular wafer made of a semiconductor material such as silicon is formed with a plurality of individual integrated circuits called dies. The first level of quality assurance will be to ensure that all component types that formed the integrated circuits can perform within specifications at the predefined lifetime. This is known as device reliability. The component types include transistors (Metal Oxide Semiconductor Field Effect Transistors, MOSFETs), gate oxide, and metal or polysilicon interconnects. Due to the high volume of reliability data required which is usually collected over long stress time, these devices are diced and packaged into dual-in-line packaged and tested over high temperature condition in a heating apparatus. The next level of quality assurance is to ensure that all infant failure is working integrated circuits are eliminated through a burn-in test before shipping to customers. The integrated circuits formed on the wafer are cut so as to separate the dies from each other. Each die is then assembled into a semiconductor package with bond wires connecting the bond pads of the die with the pins of the package. Once the die is assembled in a package it undergoes a burn-in test to ensure the quality and reliability of semiconductor devices. It is absolutely necessary to conduct the burn-in test, which is a screening test held under high temperatures in a heating apparatus in order to eliminate early failures before shipment.

U.S. Pat. No. 5,574,384 discloses a heating apparatus with a combined board, which together is capable of transmitting signals to the semiconductor device under test at a super high speed and of being connected to a large number of terminals. The carrier modules consist of combined board, which includes a burn-in or load board, carrier of the packaged integrated circuits, and a driver board. The burn-in board has sockets on a first surface for accepting the semiconductor devices and first terminals extending from the sockets to protrude from a first backside of the burn-in board. The driver board has a second surface carrying an electronic circuit to drive the semiconductor devices and a second backside with second terminals for connecting the electronic circuit to the first terminals.

U.S. Pat. No. 5,327,075 discloses a burn-in apparatus includes a burn-in test chamber for accommodating a plurality of semiconductor devices to be tested. In particular, the burn-in apparatus also includes measuring devices for detecting electric characteristics of temperature sensors built in the respective semiconductor devices to individually measure junction temperatures of the semiconductor chips, and laser-emitting mechanisms or electric heating members. The laser-emitting mechanisms or the heating members are controlled by control units, based on outputs of the measuring devices. Thus, the junction temperatures are maintained in a set junction temperature range, and the screening accuracy can be improved.

U.S. Pat. No. 7,114,556 discloses a burn-in heating apparatus with heat exchanger that can accommodate a high power integrated circuit chip for burn-in temperature stressing. The heat exchanger includes a heat sink having a chip engaging surface that is adapted to engage a surface of the chip. A liquid layer fills a heat exchange gap between the surface of the chip and the chip engaging surface of the heat sink. The liquid layer provides a low thermal resistance juncture between the chip engaging surface of the heat sink and the surface of the chip, which allows for greater heat transfer between the two surfaces.

SUMMARY OF THE INVENTION

One aspect of the present invention provides a heating apparatus with a design for a removable carrier of packaged devices, or packaged integrated circuits allowing initiation of a heating to a predefined high temperature for test of fresh semiconductor devices while other semiconductor device is undergoing the high temperature test in the same heating apparatus without affecting the high temperature environment within the heating apparatus.

A heating apparatus for semiconductor devices according to this aspect of the present invention comprises an oven including a back wall having a plurality of back openings and a front wall having a plurality of front openings, a carrier module configured to load semiconductor devices into the oven through the front opening in a removable manner, a temperature-controlling module configured to control the temperature of the oven, and a test module positioned at a backside of the oven and configured to generate, receive or switch electrical test signals for the semiconductor devices in the oven, wherein the carrier module connects to the test module at the back of the heating apparatus Due to the design for the carrier module which allows for removable through the front openings of the front wall, the heating apparatus of the present invention allows the initiation of a new high temperature test for one semiconductor device loaded on one carrier module while another semiconductor device loaded on another burn-in module is undergoing the burn-in test in the same burn-in oven.

BRIEF DESCRIPTION OF THE DRAWINGS

The objectives and advantages of the present invention are illustrated with the following description and upon reference to the accompanying drawings in which.

DETAILED DESCRIPTION OF THE INVENTION

Figure 1:
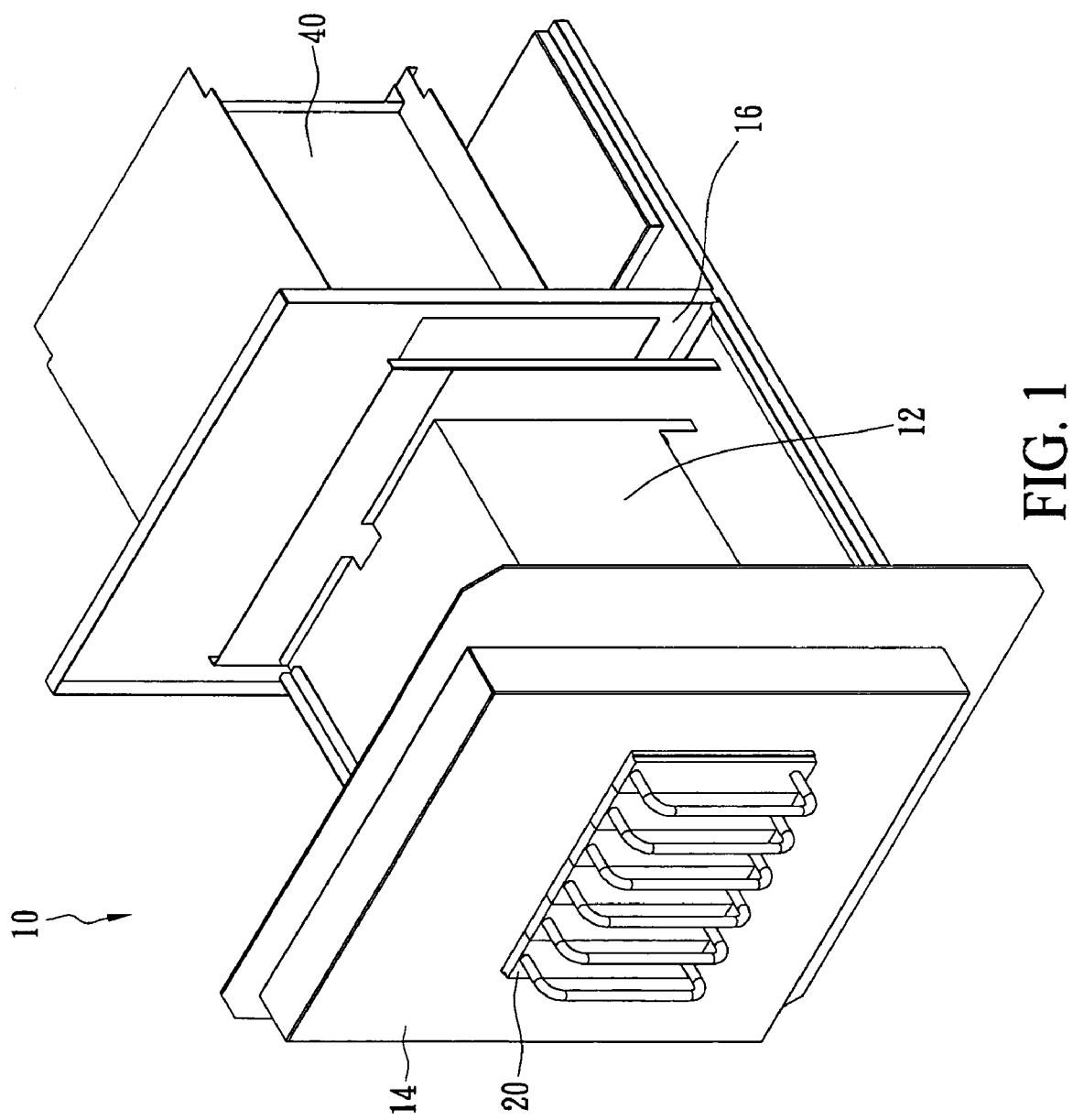
FIG. 1 to FIG. 5 illustrate a heating apparatus for semiconductor devices according to one embodiment of the present invention.
Figure 2:
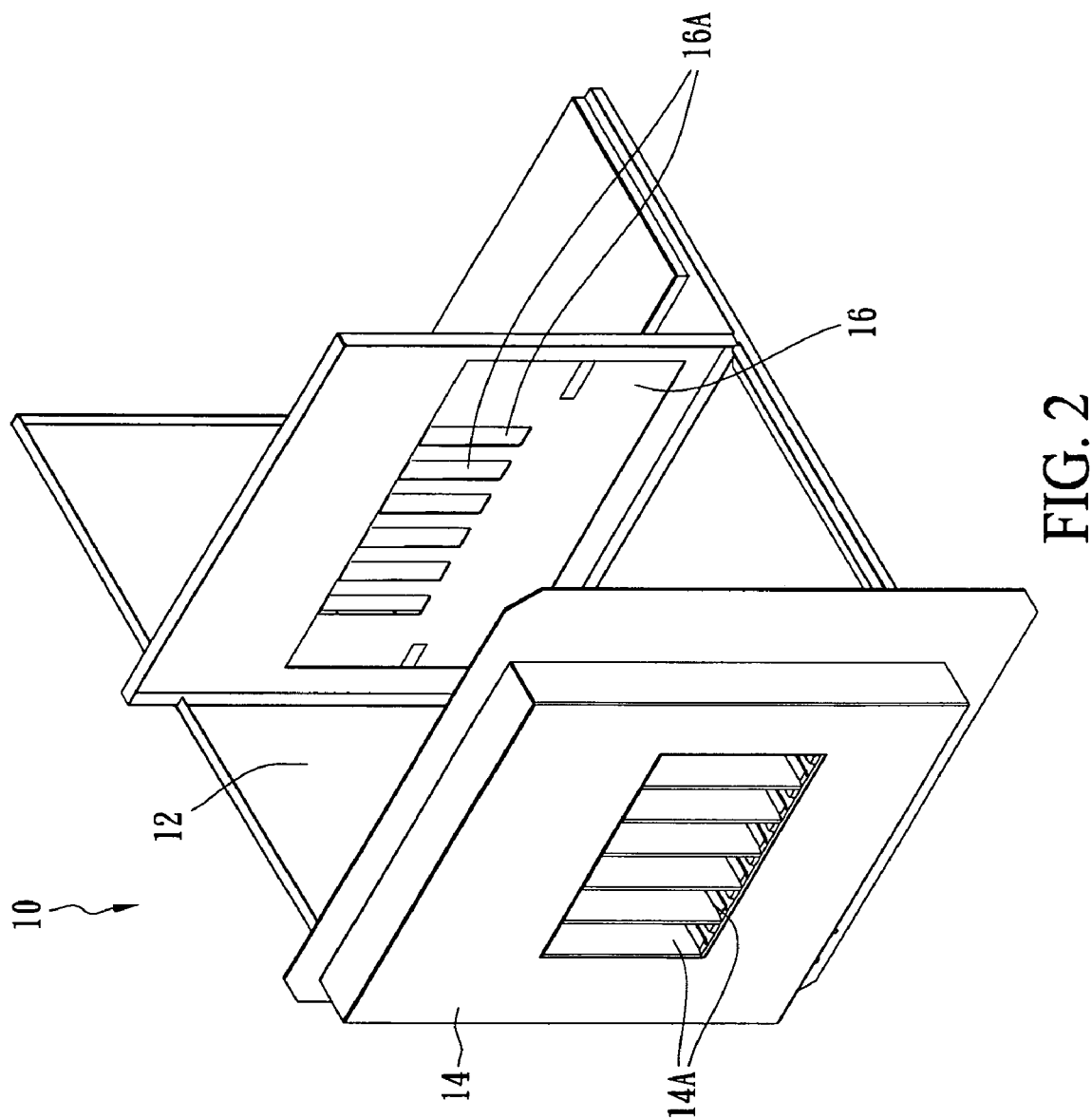

FIG. 1 to FIG. 5 illustrate a heating apparatus 10 for semiconductor devices according to one embodiment of the present invention. Referring to FIG. 1 and FIG. 2, the heating apparatus 10 comprises an oven 12 including a front wall 14 having a plurality of front openings 14A and a back wall 16 having a plurality of back openings 16A, a carrier module 20 configured to load semiconductor devices into the oven 12 through the front opening 14A in a removable manner, a test module 40 positioned at a backside of the oven 12, and a temperature-controlling module 50 configured to control the temperature of the oven 12.

Figure 3:
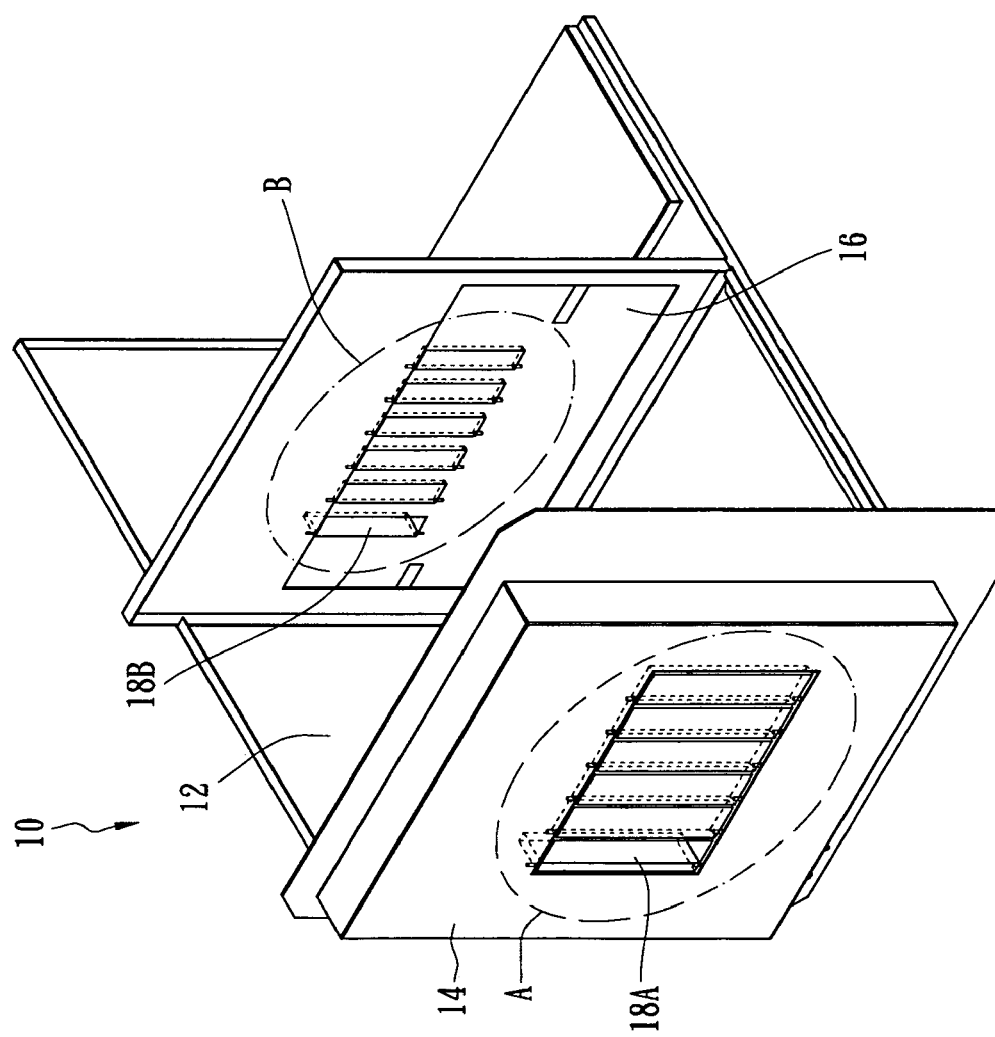
Figure 4:
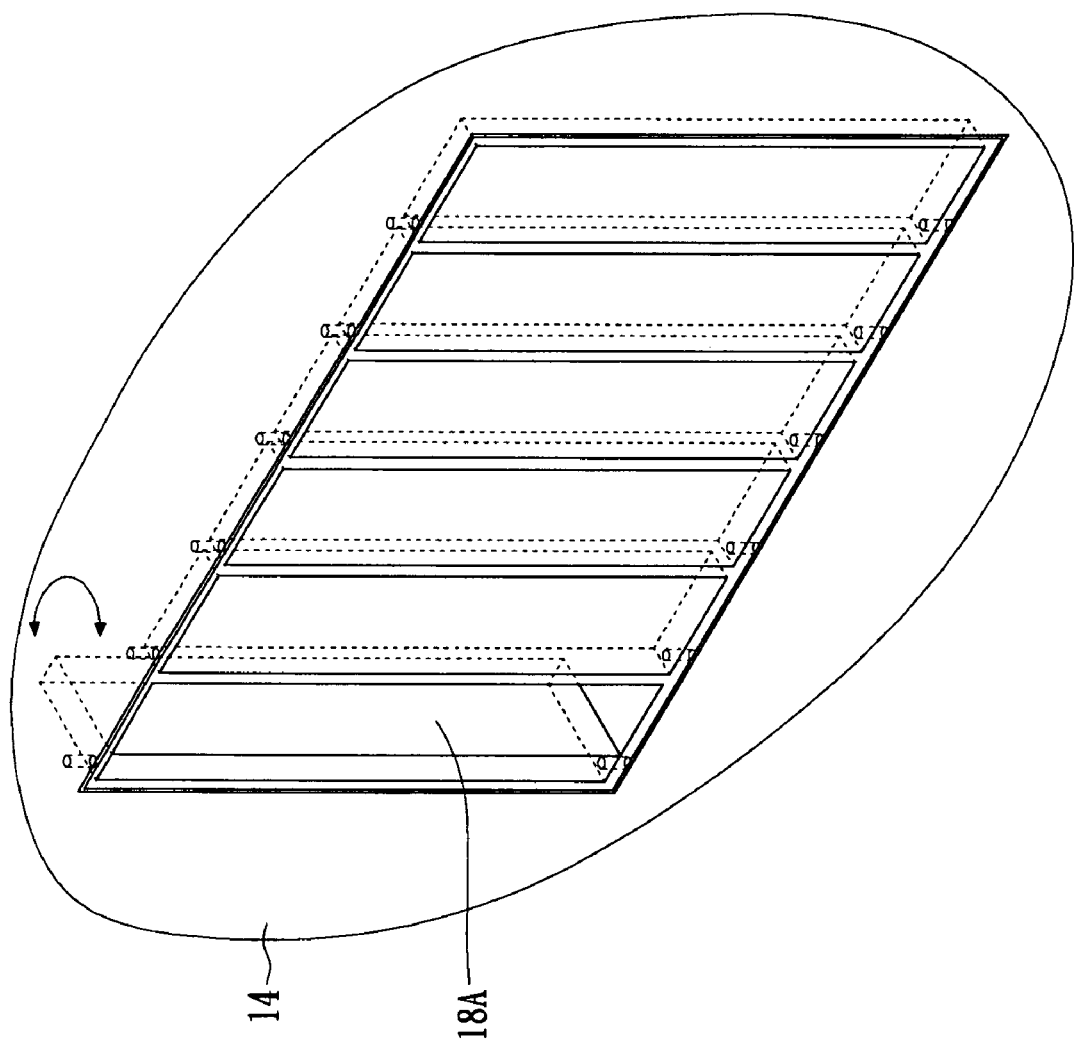
Figure 5:
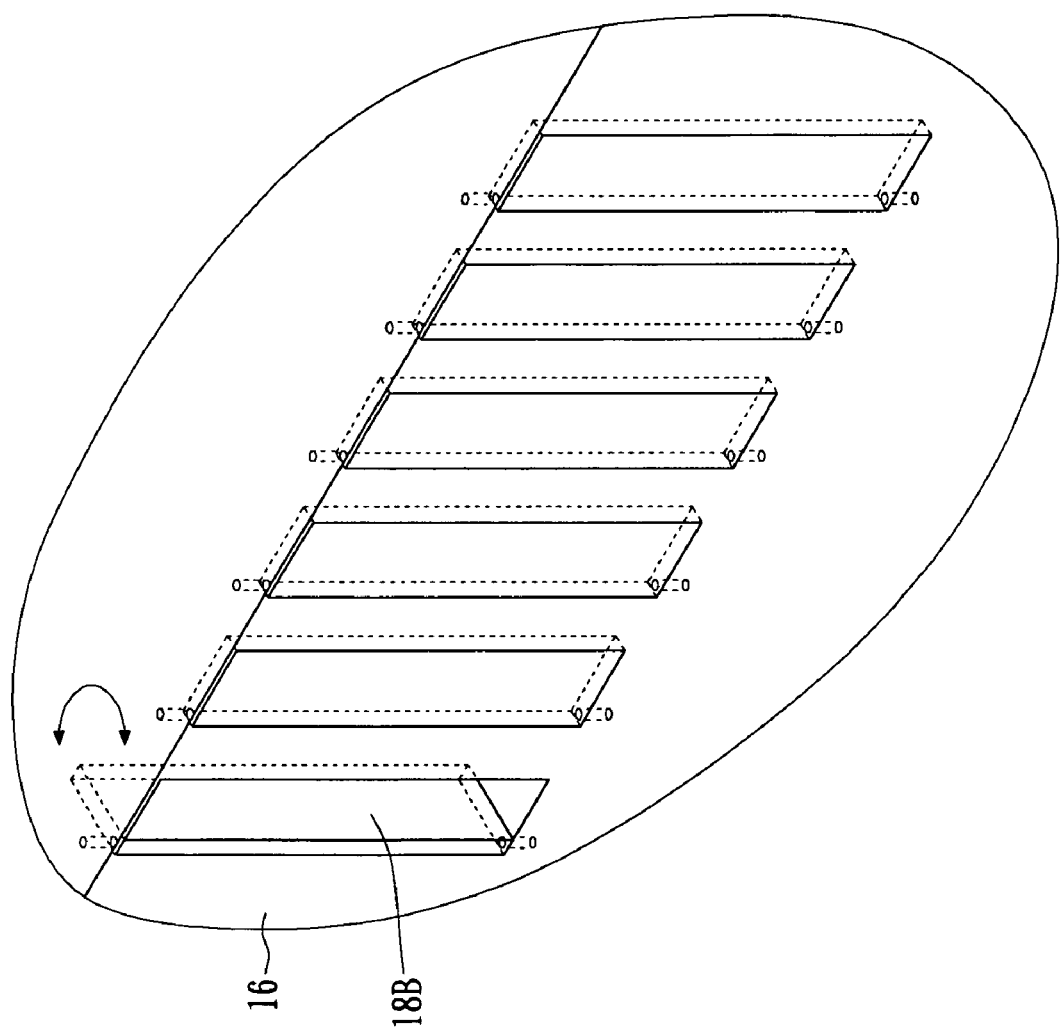

The test module 40 is electrically connected to the carrier module 20 through the back opening 16A of the back wall 16, and configured to either generate, receive or switch electrical test signals for the semiconductor devices in the oven 12. In addition, the front openings 14A and back openings 16A are each isolated through a self-closing door 18A, 18B to isolate the internal of the heating apparatus 10 with the surrounding environment, as shown in FIG. 3-5.

Figure 6:
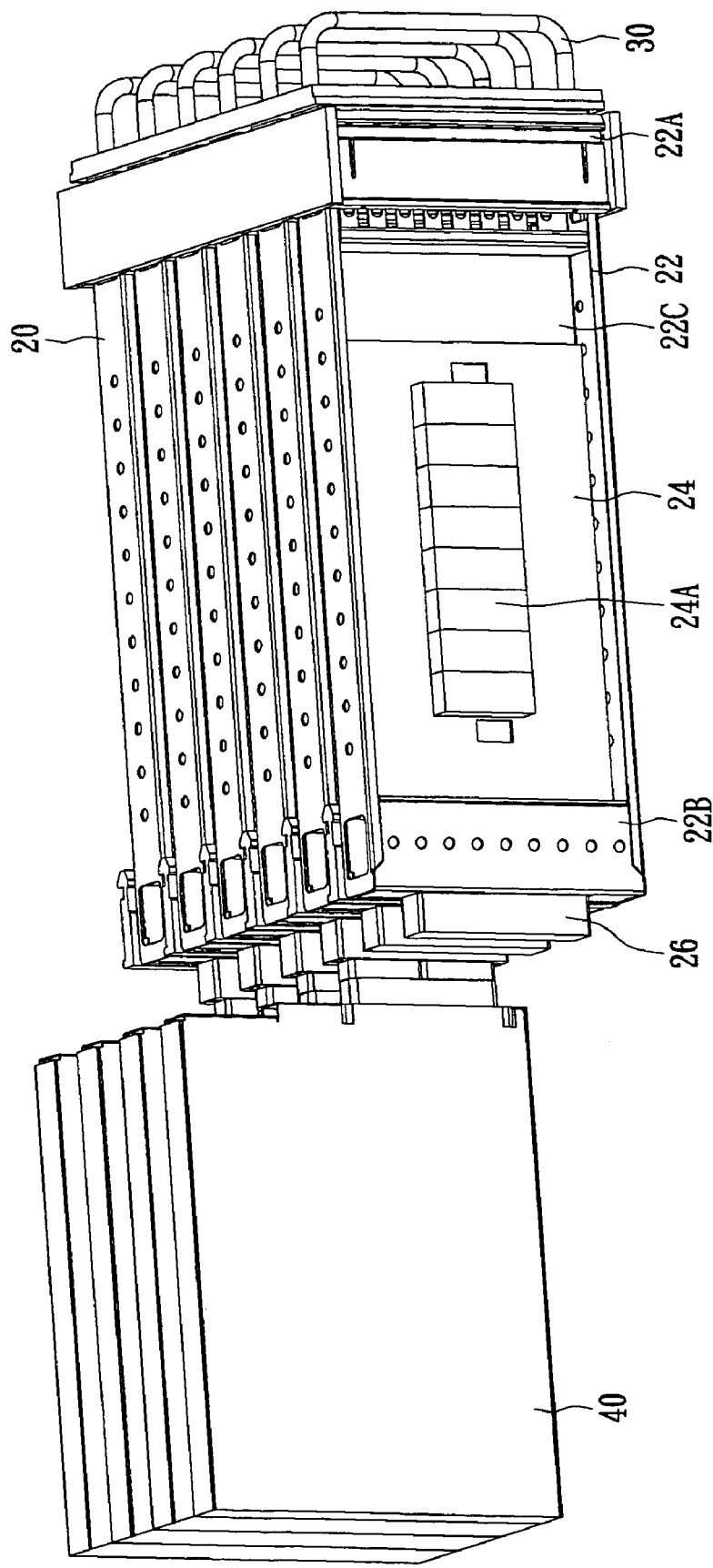
FIG. 6 and FIG. 7 illustrate a carrier module according to one embodiment of the present invention.
Figure 7:
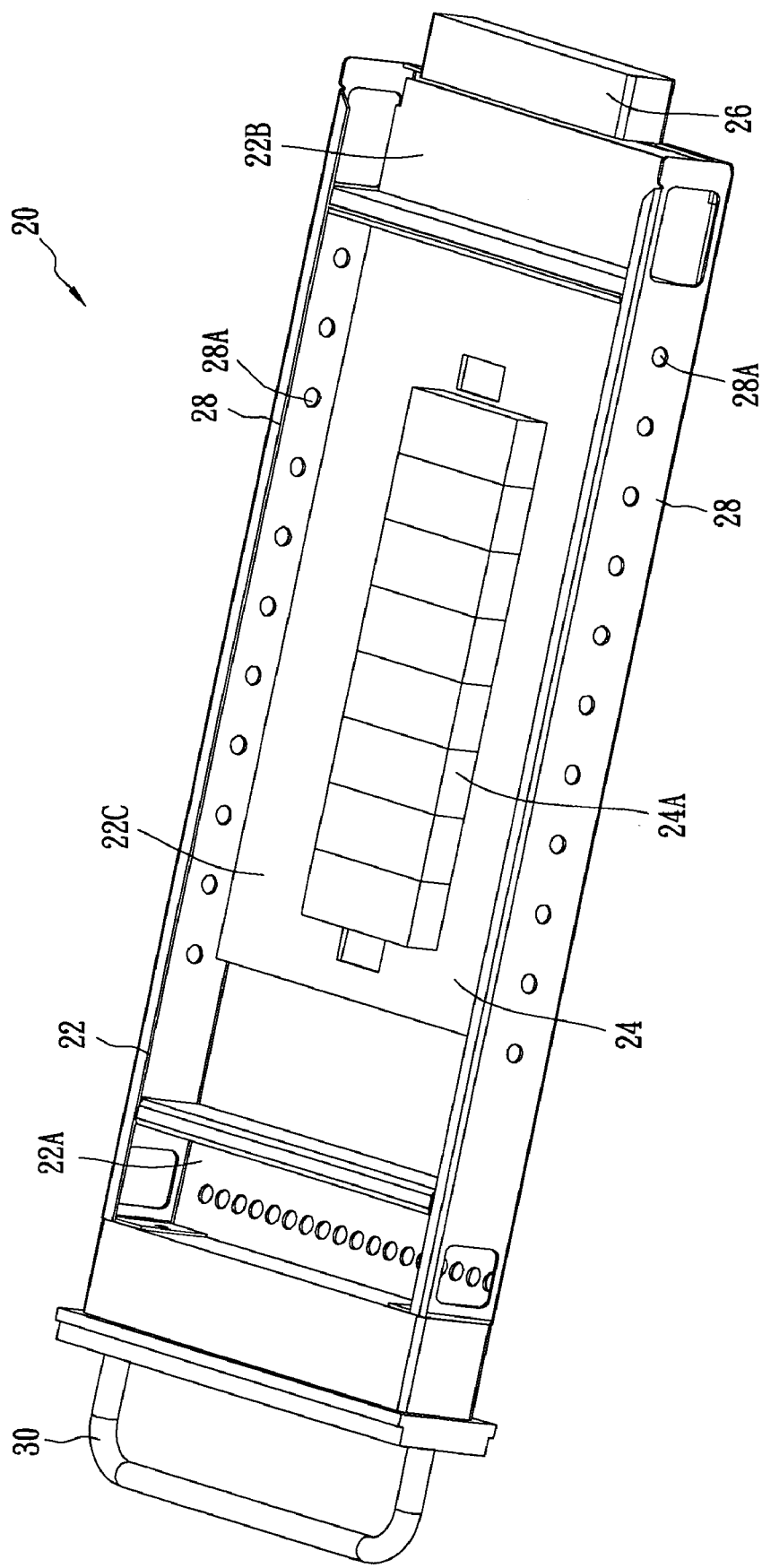

FIG. 6 and FIG. 7 illustrate a carrier module 20 according to one embodiment of the present invention. The carrier module 20 includes a frame 22 having a front buffer portion 22A, a back buffer portion 22B and a test chamber 22C sandwiched between the front buffer portion 22A and the back buffer portion 22B, a circuit board 24 positioned in the test chamber 22C and having a plurality of sockets 24A configured to receive the semiconductor devices, and a connector 26 positioned at a back side of the frame 22 for electrical connection with pattern generator 40. In particular, the frame 22 includes two side plates 28 having a plurality of apertures 28A enabling hot air flow for transfer of thermal energy from the test chamber 22C of the oven 12 with the carrier module 20 when the carrier module 20 is inserted into the oven 12.

When the carrier module 20 is inserted into the oven 12 through the front opening 14A, the front buffer portion 22A is positioned in the front wall 14 and the back buffer portion 22B is positioned in the back wall 16 for thermal isolating the test chamber 22C such that the temperature of the inserted carrier module 20 will not be affected by the external environment. This enables the carrier module 20 to be totally isolated and is able to maintain at a stable temperature during test. Furthermore, the carrier module 20 further includes a grip member 30 positioned at a front side of the frame 22 for operators to insert the carrier module 20 into the oven 22 for initiating a new burn-in or reliability test or pull the burn-in module 20 out of the oven 22 when the burn-in or reliability test is completed.

Figure 8:
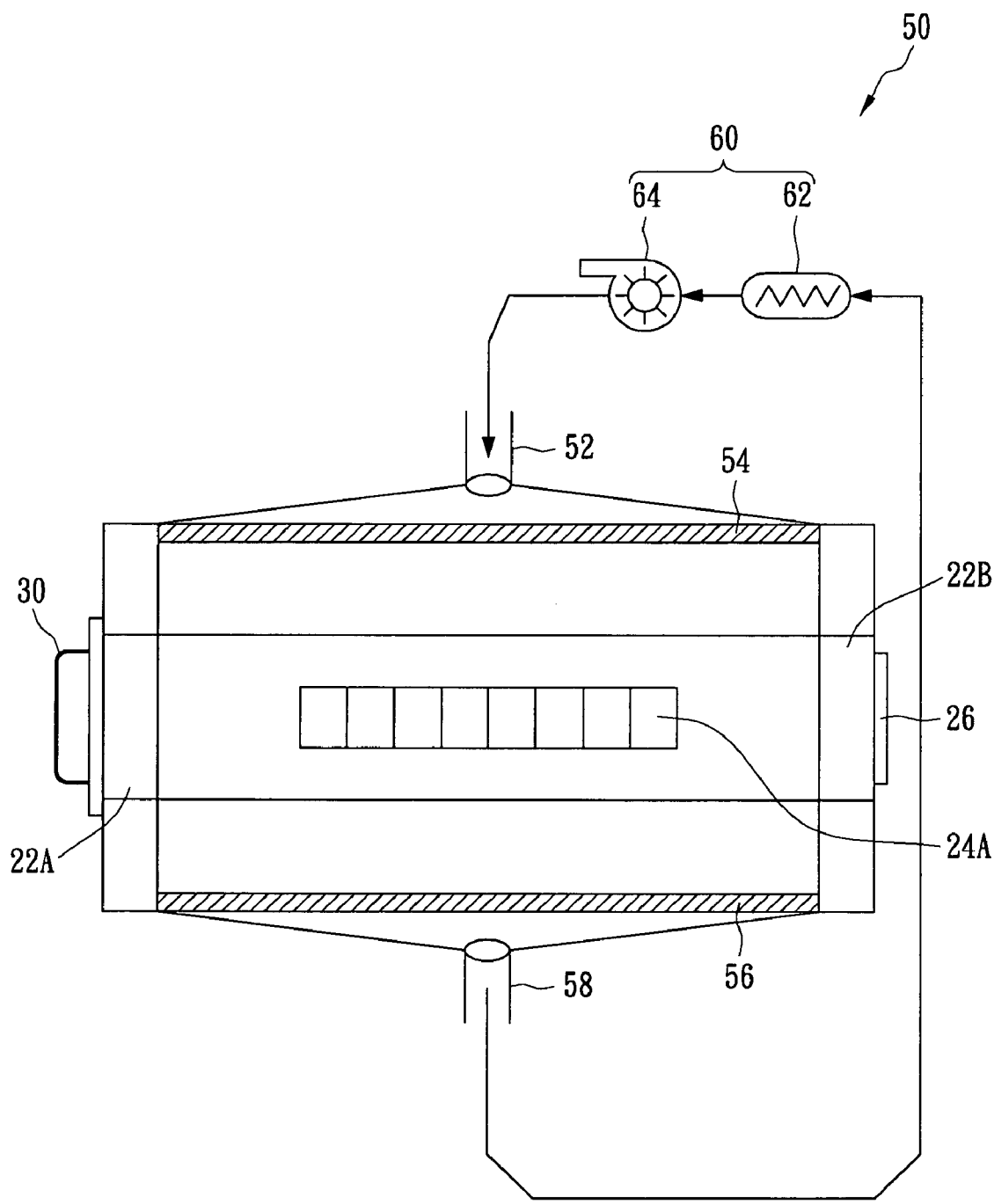
FIG. 8 and FIG. 9 illustrate a temperature-controlling module according to one embodiment of the present invention.
Figure 9:
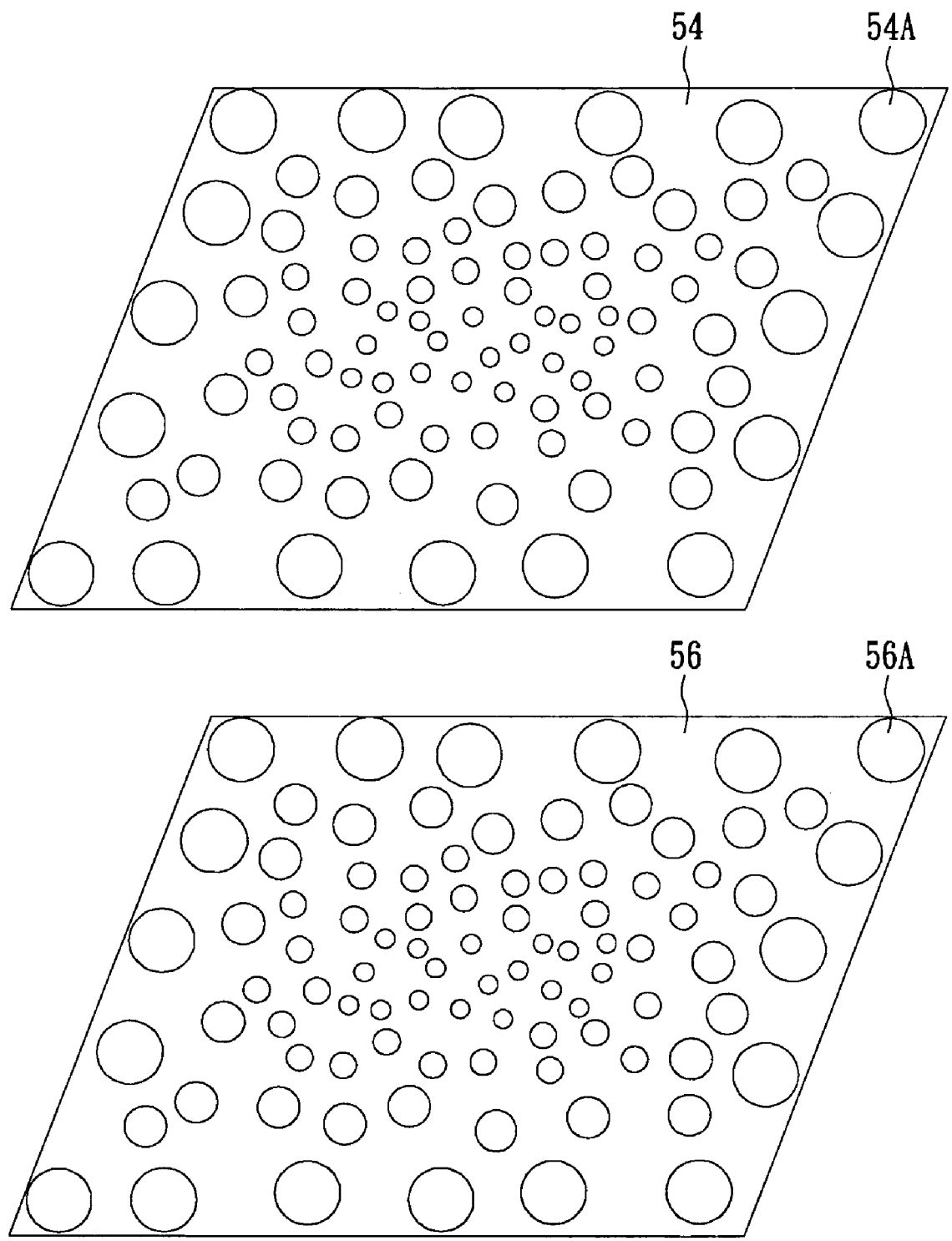

FIG. 8 and FIG. 9 illustrate a temperature-controlling module 50 according to one embodiment of the present invention. The temperature-controlling module 50 includes an inlet pipe 52 configured to deliver heated air, a distributor 54 having a plurality of distributing holes 54A configured to distribute the heated air from the inlet pipe 52 into the oven 12, a collector 56 having a plurality of collecting holes 56A configured to collect heated air from the oven 12. Furthermore, the temperature-controlling module 50 also includes outlet pipe 58 configured to deliver the heated air from the collector 56 to a heating unit 60 including a heater 62 and a blower 64. In particular, the distributor 54 is positioned on the top of the oven 12 and the collector 56 is positioned at the bottom of the oven 12. The distributing holes 54A at the center of the distributor 54 are designed to be smaller than these at the edge of the distributor 54, and the collecting holes 56A at the center of the distributor 56 are also designed to be smaller than these at the edge of the distributor 56 such that the heated air from the inlet pipe 52 uniformly flows into the oven 12 through the distributor 54 and out of the oven 12 through the collector 56.

The design for the carrier module 20, which allows for easy removable through the front openings 14A of the front wall 14 of the heating apparatus 10. This design of the self-closing door 18A 18B enables the temperature of the heating apparatus 10 to be well controlled and maintained in a constant temperature even if the carrier module 20 is removed. The present invention allows the initiation of a new burn-in or reliability test for new semiconductor devices that is reloaded on the carrier module 20 while another semiconductor device loaded on another carrier module 20 is undergoing the burn-in test in the same burn-in oven 12.

The above-described embodiments of the present invention are intended to be illustrative only. Numerous alternative embodiments may be devised by those skilled in the art without departing from the scope of the following claims.

What is claimed is:

1. A heating apparatus for semiconductor devices, comprising:
    an oven including a back wall having a plurality of back openings and a front wall having a plurality of front openings, each front opening having a self-closing door;
    a carrier module configured to load semiconductor devices into the oven through the front opening in a removable manner;
    a temperature-controlling module configured to control the temperature of the oven; and
    a test module positioned at a backside of the oven and configured to generate, receive or switch electrical test signals for the semiconductor devices in the oven, and the carrier module connecting to the test module at the back of the heating apparatus.

2. The heating apparatus for semiconductor devices of claim 1, wherein the test module is electrically connected to the carrier module through the back opening of the back wall.

3. The heating apparatus for semiconductor devices of claim 1, wherein the carrier module includes:
    a frame having a front buffer portion, a back buffer portion and a test chamber sandwiched between the front buffer portion and the back buffer portion;
    a circuit board positioned in the test chamber and having a plurality of sockets configured to receive the semiconductor devices; and
    a connector positioned at a back side of the frame.

4. The heating apparatus for semiconductor devices of claim 3, wherein the frame includes two side plates having a plurality of apertures communicating the test chamber with the oven.

5. The heating apparatus for semiconductor devices of claim 3, wherein the front buffer portion is positioned in the front wall and the back buffer portion is positioned in the back wall as the carrier module is inserted into the oven through the front opening.

6. The heating apparatus for semiconductor devices of claim 3, wherein the carrier module further includes a grip member positioned at a front side of the frame.

7. The heating apparatus for semiconductor devices of claim 1, wherein the oven includes a plurality of self closing doors configured to seal the front openings and the back openings.

8. The heating apparatus for semiconductor devices of claim 1, wherein the temperature-controlling module comprises:
    an inlet pipe configured to deliver heated air;
    a distributor having a plurality of distributing holes configured to distribute the heated air from the inlet pipe into the oven to ensure uniform temperature control within the heating apparatus;
    a collector having a plurality of collecting holes configured to collect heated air from the oven; and
    an outlet pipe configured to deliver the heated air from the collector to the heating unit.

9. The heating apparatus for semiconductor devices of claim 8, wherein the distributor is positioned on the top of the oven and the collector is positioned at the bottom of the oven.

10. The heating apparatus for semiconductor devices of claim 8, wherein the distributing holes at the center of the distributor is smaller than these at the edge of the distributor.

11. The heating apparatus for semiconductor devices of claim 8, wherein the collecting holes at the center of the distributor is smaller than these at the edge of the distributor.

* * * * *